United States Patent [19]

Castelluzzo

[11] 4,182,789
[45] Jan. 8, 1980

[54] MULTI-LAYER GRAPHIC ARTS TAPE SYSTEM

[75] Inventor: James M. Castelluzzo, New York, N.Y.

[73] Assignee: T.M. Invention Associates, New York, N.Y.

[21] Appl. No.: 930,700

[22] Filed: Aug. 3, 1978

[51] Int. Cl.$^2$ .......................... B41L 1/28; B41L 1/36; B32B 3/10; C09J 7/02
[52] U.S. Cl. ...................................... 428/40; 428/138; 428/212; 428/354; 101/DIG. 12; 282/12 A; 282/DIG. 2; 283/37
[58] Field of Search ................. 101/DIG. 12; 283/37; 282/DIG. 2, 12 A, 1 A; 96/43; 428/40, 138, 354, 352, 914, 343, 212; 156/252, 291

[56] References Cited

U.S. PATENT DOCUMENTS

| | | | |
|---|---|---|---|
| 3,257,228 | 6/1966 | Reed | 428/354 X |
| 3,909,329 | 9/1975 | Smolen | 428/198 X |
| 4,015,034 | 3/1977 | Smolen | 101/DIG. 12 X |

Primary Examiner—George F. Lesmes
Assistant Examiner—Alexander S. Thomas
Attorney, Agent, or Firm—Gottlieb, Rackman & Reisman

[57] ABSTRACT

There is disclosed a multi-layer tape system for applying register marks or other symbols to aligned artwork sheets used in the graphic arts field. In a two-layer system each of two superimposed clear tapes has aligned markings printed thereon. A weak adhesive secures the two tapes together, and the two outer surfaces are coated with a strong adhesive. In a four-layer system, a separator is disposed between a pair of two-layer systems; the separator has holes therein so that the two tape systems can adhere to each other and remain in alignment, contact being made in the regions of the holes. The relative adhesive strengths maintain the system integrity prior to use while also permitting tape separation during use.

14 Claims, 10 Drawing Figures

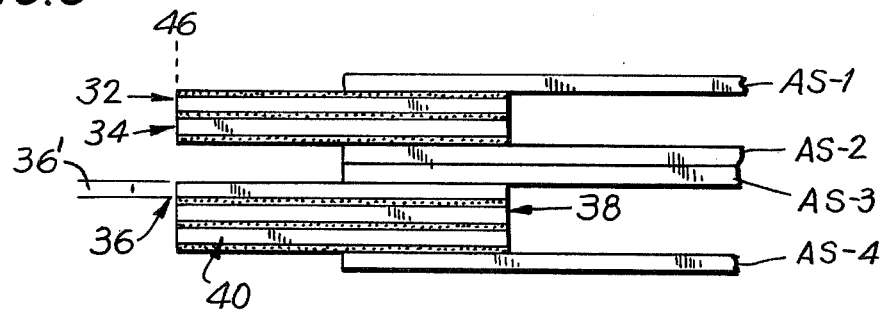
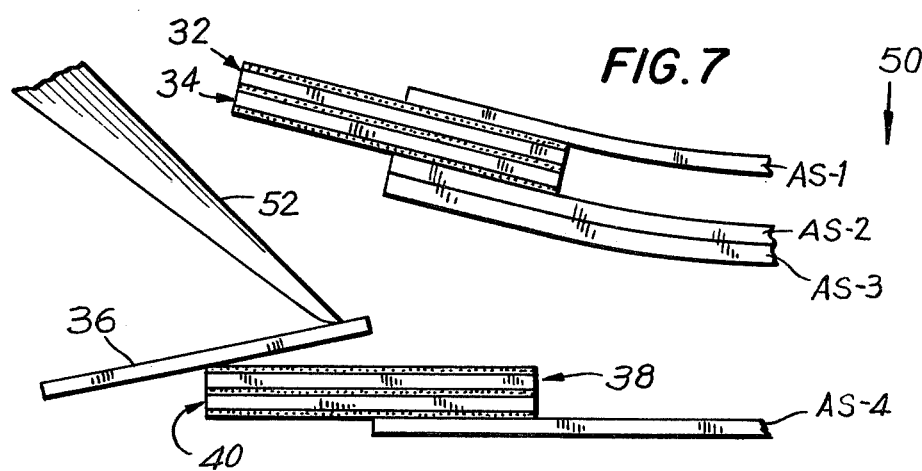
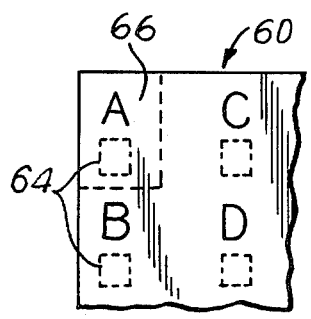
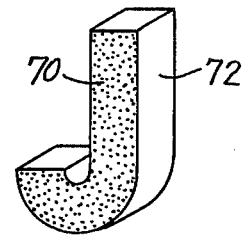
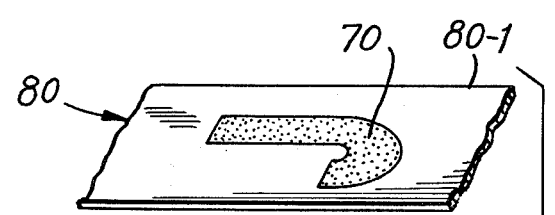
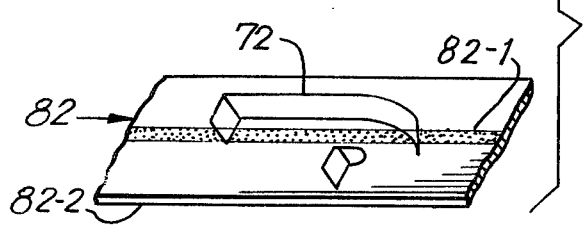

MULTI-LAYER GRAPHIC ARTS TAPE SYSTEM

This invention relates to the graphic arts field, and more particularly to multi-layer tape systems for applying aligned markings (register marks or other symbols) to individual sheets containing artwork thereon.

In order to print multi-color materials, it is necessary to make an individual printing plate for each color. The first step in this process consists of preparing a separate drawing or "artwork" on a sheet of translucent or transparent material for each color. The designs on all of the sheets have predetermined positional relationships with each other. In order to allow for the alignment of the sheets, and the alignment of the printing plates which are ultimately made, it is necessary to apply register marks on the translucent or transparent sheets, with the register marks being aligned with each other. It is customary to provide three marks on each sheet; each mark may consist of a circle with two perpendicular diameters.

The conventional technique for applying register marks involves the use of a roll of clear tape, or a clear sheet, coated with adhesive on one side and containing the register marks. A piece of the roll or the sheet is cut and applied directly to one of the artwork sheets. The designer must make certain that the three register marks applied to each sheet are aligned with the register marks on all of the other sheets—a tedious and very time-consuming process.

An alternative and less time-consuming method for applying register marks is disclosed in Smolen U.S. Pat. No. 3,909,329, issued on Sept. 30, 1975 and entitled "Article for Applying Register or Index Marks and Method of Using the Same". As set forth in the aforementioned patent, a carrier sheet is provided, the opposed surfaces of which have aligned markings. The markings comprise dry transfer indicia. When the carrier is placed between two superimposed art work sheets and the upper sheet is rubbed with a stylus, a marking is transferred to each of the two sheets. The Smolen arrangement avoids alignment problems, provided that only two artwork sheets are involved. If more than two sheets are involved, it is necessary to align the markings for new sheets to the markings already on old sheets. But an even greater problem with the arrangement is that a considerable amount of rubbing is required in order to transfer the indicia, and the indicia are prone to being scraped off and smudged, a common occurrence in view of the fact that the artwork sheets are handled many times.

It is a general object of my invention to provide an article for facilitating the application of aligned markings to superimposed artwork sheets which overcomes prior art difficulties.

Before proceeding to describe my invention, it should be understood that it makes no difference whether the article of my invention is in roll or sheet form. The article is a "tape system" which includes two or more tapes having aligned markings printed thereon. A typical tape system may have a width of ½" and it may be provided in roll form (similar to adhesive tape). Similarly, if provided in sheet form, the sheet should be considered as a plurality of side-by-side tape systems. The essence of the invention is the tape system itself, and not whether an individual tape system is supplied in roll form, or whether a plurality of side-by-side tape systems are provided in sheet form.

It should also be understood that the graphic arts tape system of my invention is not limited to the application of register marks to artwork sheets, although this will certainly be a primary application of the invention. The "aligned" markings need not even be identical. For example, consider the preparation of an electronic schematic which is to be printed in color. Certain components to be symbolized on the drawing may have different parts which are to be shown in two colors. In this case, the tape system might include two markings which depict the two different parts of the component (for the two different colors), with each part being applied to a different artwork sheet. The two markings are "aligned" not in the sense that they are identical and "fit" each other perfectly, but rather in the sense that they cooperate with each other to convey a unitary piece of information or a composite symbol. Similar remarks apply, for example, to the several parts of a multi-color border which might be desired for the final printed work.

In the simplest form of my invention, two clear face-to-face tapes are provided, with aligned markings being printed on the tapes (as individual markings are printed on a prior art single tape). The two tapes are held together by a weak adhesive, and the outer surfaces of the two tapes are coated with a strong adhesive. When a piece of the tape system is cut and placed between two artwork sheets, following which pressure is applied to the upper sheet, each of the tapes adheres to the sheet with which it makes contact. When the two sheets are separated, a different one of the two tapes adheres to each. This is due to the fact that the bonding force holding the two tapes together is less than the bonding force securing each tape to its respective sheet.

When markings must be applied to more than two sheets, a three-layer or four-layer tape system is used. (The former is the same as the latter, but with one of the outermost tapes omitted.) The four-layer system includes a pair of two-layer systems, in face-to-face relationship. But were the two two-layer systems simply "stuck" together, it would be difficult to separate them and apply them to different artwork sheets, as will become apparent below when the method of using a four-layer tape system is described. For this reason, a separator strip, such as one with a Teflon coating, is used to separate the two two-layer systems. The separator strip allows the individual two-layer systems to be peeled away from each other with no difficulty.

In order to maintain the four tapes in alignment before they are used, each individual two-layer system must adhere on one of its surfaces to the separator. Toward this end, the bonding of the "sandwich" should be maximized. But, as will be explained below, in order to use the tape system with the greatest ease, it is important that the separator be removed with a minimum of effort, a goal which requires the minimization of the bonding force between the separator and the two facing tapes.

These competing objectives are both satisfied in the preferred embodiment of the invention by providing holes in the separator strip, the aligned markings on the tapes alternating with the holes in the separator. The adhesives on the tapes which face the separator bond only weakly to the separator due to the physical characteristics of the separator (Teflon), but the tapes are held in alignment because in the regions of the holes, the adhesive coatings on the two tapes on either side of the separator adhere to each other. Thus the holes guarantee that the tapes remain in alignment. As will be described below in connection with use of the tape system, any section of the tape system which contains a hole is cut during application of the markings to the artwork sheets, following which the remaining piece of the separator can be peeled away with almost no effort. It is to be understood, however, that the holes are not essential (although they are preferred); if the separator does not include holes, then the separator material must be such that the adhesive bonding of the tapes to the separator is sufficient to hold the tapes in alignment, but not great enough to make it difficult to remove the separator during application of the markings to the artwork sheets.

Further objects, features and advantages of my invention will become apparent upon consideration of the following detailed description, in conjunction with the drawing, in which:

FIG. 6 depicts a side view of the "sandwich" of FIG. 5;

FIG. 7 depicts the manner in which the separator strip is removed (from which the final step in the use of the invention will be apparent, as will be explained below);

FIG. 8 depicts an embodiment of the invention in sheet form;

FIG. 9A depicts a typical graphic arts symbol having two parts; and

FIG. 9B depicts the manner in which the two parts of the symbol of FIG. 9A are aligned on two layers of a two-tape system.

Figure 1:
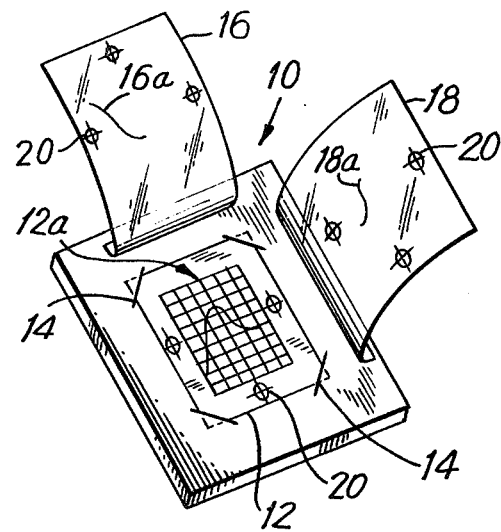
FIG. 1 depicts the prior art technique in widespread use for applying register marks to artwork sheets.

Referring to FIG. 1, the drawing shows the conventional prior art technique for drawing three artwork sheets to be used for the making of plates to print a three-color graph. A first acetate sheet 12 is secured to an illustration board 10 by four pieces of adhesive tape 14 at the corners. On this sheet there are drawn grid lines and a first curve, shown together by the numeral 12a. Typically, the plate made from the sheet will print with black ink.

A first acetate overlay sheet 16 is secured to board 10 at its upper edge. With sheet 16 laying flat on top of sheet 12, another curve 16a is drawn, the curve being fitted along the grid lines of sheet 12. (Typically, all three drawings are made with black ink; different colors are used only during printing.) A third overlay sheet 18 is secured to the right edge of board 10, and still a third curve 18a is drawn on it when it overlays sheet 12 (or sheets 12 and 16, if sheet 16 is not pulled back). The two plates made from sheets 16 and 18 will typically print in two different colors (other than black).

In order to allow the sheets to be aligned after they are removed from the board, and in order to align the printing plates in a press, three register marks 20 are applied to each of sheets 12, 16 and 18, the register marks on the three sheets being aligned with each other.

The register marks are applied along the borders of the sheets, in regions which do not print during the final run of the press. The register marks are applied either on an individual basis (by cutting a single mark from a roll or sheet of tape and applying it directly to one of the sheets), or by using arrangements such as that of Smolen described above which permit two aligned marks to be applied simultaneously to two sheets.

The artwork is drawn in the same way when using the tape system of my invention. Although the artwork sheets may be secured to two or more borders of the illustration board 10, it is preferred to secure all of the artwork sheets to the same border (as is also known in the art). In the following description, it is to be understood that the artwork sheets are all secured to the same border of the board. This simply means that when drawing on any of the sheets, all of the sheets beneath it must be layed flat on the board. This is no problem because the sheets are transparent. The bottom sheet may be secured to the board as shown in FIG. 1, or it may have only one of its edges secured to the border of the board, as is the case with the other sheets.

Figure 2:
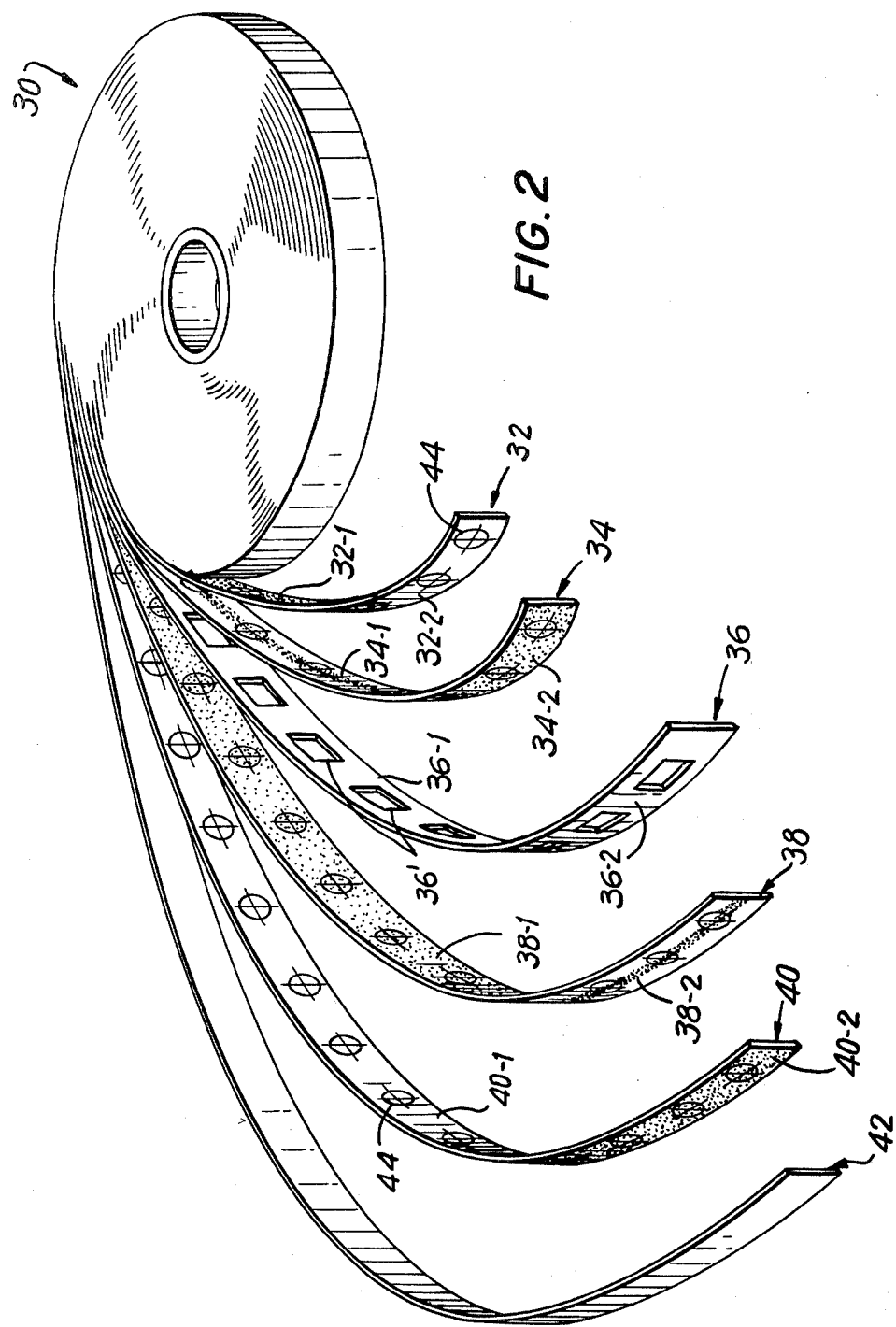
FIG. 2 depicts a four-layer tape system in accordance with the principles of my invention, in roll form, in which the layers in the tape system are shown separated for explanatory purposes.

FIG. 2 depicts a four-layer tape system in accordance with the principles of my invention. The tapes themselves are numbered 32, 34, 38 and 40, and in the case of FIG. 2 aligned register marks 44 are printed on all four tapes. On a first surface of tape 32, an adhesive coating 32-1 is applied. This adhesive ultimately bonds a cut piece of the tape to an artwork sheet. A narrow line of adhesive 34-1 is applied to the first surface of tape 34, and the second surface of this tape is completely coated with adhesive 34-2. Adhesive 34-2 ultimately bonds a cut piece of tape 34 to a second artwork sheet. Adehsive 34-1 bonds tapes 32 and 34 to each other until the tapes are separated. This bonding force is less than that provided by each of adhesive layers 32-1 and 34-2 which secures its respective tape to an artwork sheet. The relative bonding strengths can be achieved by using the same adhesive wherever adhesive is used, but using less of it (e.g., a narrow line as in FIG. 2) wherever a weaker bonding force is required. Alternatively, even the facing surfaces of tapes 32 and/or 34 can be completely coated with adhesive provided that a weaker adhesive is used. It is to be understood that instead of applying adhesive to the first surface of tape 34, it can be applied to the second surface of tape 32 (or even to both surfaces). An important point to note is that when tapes 32 and 34 are in face-to-face relationship, it is the two outer surfaces which have the adhesive coatings for adherement of the tapes to respective artwork sheets.

Tapes 38 and 40 are comparable to tapes 32 and 34. Adhesive coatings 38-1 and 40-2 serve to secure the tapes to third and fourth artwork sheets, and adhesive coating 38-2, of lesser bonding strength, holds the two tapes together.

Were the two two-tape systems placed against each other, adhesive coatings 34-2 and 38-1 would adhere to each other, it would be difficult to separate tapes 34 and 38, and the tape system would not be practical. In order to maintain the four tapes in alignment before they are used and even as they are being used, while at the same time allowing tapes 34 and 38 to be separated without difficulty, a separator strip 36 (e.g., Teflon-coated fiberglass) is provided. Neither of the surfaces 36-1 and 36-2 is coated with adhesive. The two adhesive coatings 34-2 and 38-1 must cause their respective tapes to adhere to the separator 36, yet at the same time allow the separator to be peeled off, as will be described below. To ensure that the tapes are maintained in alignment, while at the same time permitting easy peeling, separator 36 is provided with a series of holes 36'; the holes alternate with the register marks (or any other symbols which may be provided). Wherever tapes 34 and 38 face each other in the region of a hole 36', the adhesive coatings 34-2 and 38-1 contact each other, thereby insuring that the tapes do not shift relative to each other. As will be described below, this is no way affects the easy separation of tapes 34 and 38 from each other during use.

Typically, the four tapes have a width of ¼". The separator strip has a width of ⅝". One of its edges is aligned with an edge of each tape, and the other separator edge extends ⅜" (although even 1/16" would be satisfactory) away from the other tape edges. This facilitates use of the tape system as will be described below.

When the tape system is provided in the form of a roll 30, it is apparent that adhesive coating 32-1 would otherwise bear against adhesive coating 40-2. This presents a situation comparable to that of conventional adhesive tape coated on both surfaces. Although there is little difficulty in such a case of pulling the tapes off from the roll, to make it even easier to do so, and in order to insure that when pulling the tapes from the roll the tapes remain in alignment, another separator 42 may be provided. This separator, with a Teflon coating to prevent sticking, serves merely to separate successive four-layer groups of tapes from each other in the roll. Before actually using the tapes, separator 42 may be removed from any portion of the tapes pulled from the roll. Separator 42 may also be ⅝" in width (although not shown in FIG. 2) if desired in order to facilitate this peeling operation. Separator strip 42 will not be referred to below inasmuch as it does not enter into the actual use of the tapes.

Separator 36 (and separator 42, if it is used) may take any of many forms, such as the Teflon-coated fiberglass material made by the Connecticut Hard Rubber Co. (TEMP-R-GLASS No. 3TB, 3TLL or 9003). The tapes themselves may be of conventional Scotch brand, printed with markings as in prior art systems.

Figure 3:
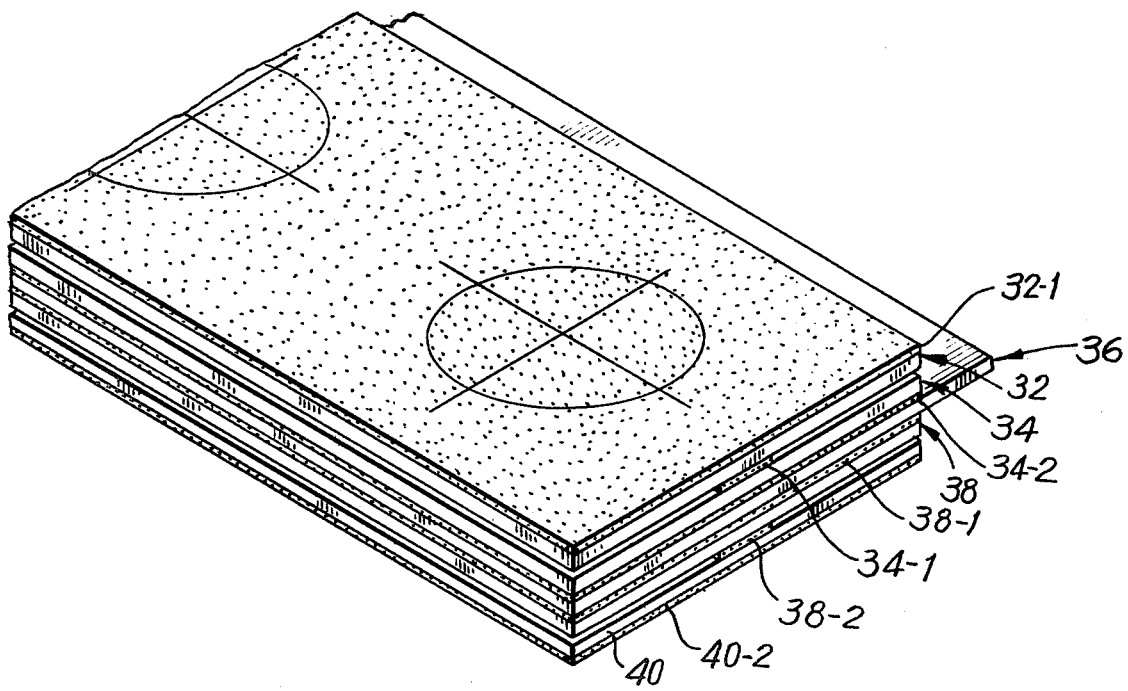
FIG. 3 is an exploded end view of the tape system of FIG. 2.

FIG. 3 depicts an end of the tape system as it comes off the roll. The thicknesses of the various adhesive layers are, of course, shown exaggerated. Before the tape system is actually used, the forward end is cut between an aligned group of register marks and a hole in the separator. It is for this reason that FIG. 3 shows separator 36 with a continuous forward edge; any leading portion containing a hole has been cut off.

Figure 4:
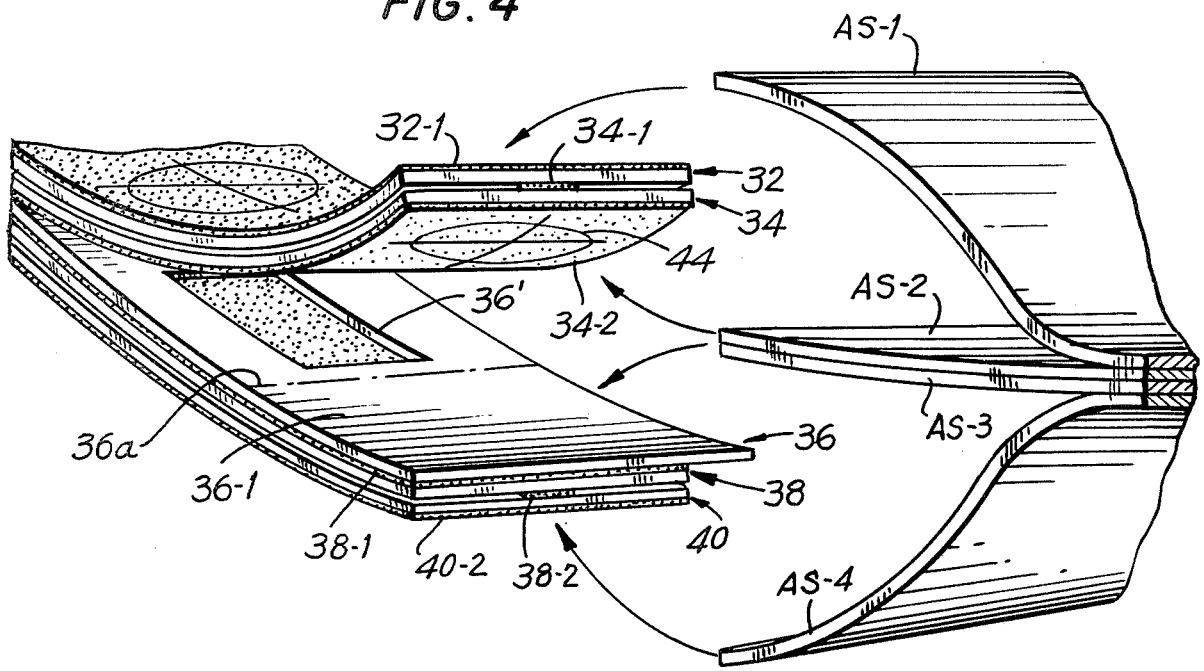
FIG. 4 depicts the manner of applying aligned markings to four artwork sheets.

The first step in the process of using the tape system is to separate tape 34 from separator 36 as shown in FIG. 4. The four artwork sheets AS-1 through AS-4 are then inserted under the tape system, between the two separated halves, and on top of it as shown in FIG. 4. Artwork sheet AS-4 typically rests on an illustration board and the tape system is pressed on top of it in the position desired for a register mark. Artwork sheets AS-2 and AS-3 are then held together and inserted between the two separated halves of the tape system up to a line just forward of hole 36', this line being shown in FIG. 4 by dashed line 36a. The top half of the tape system is then allowed to fall down on sheet AS-2, and lastly sheet AS-1 is placed on top of tape 32. By then rubbing on top of sheet AS-1, tape 32 adheres to sheet AS-1, tape 34 adheres to sheet AS-2 and tape 40 adheres to sheet AS-4.

Figure 5:
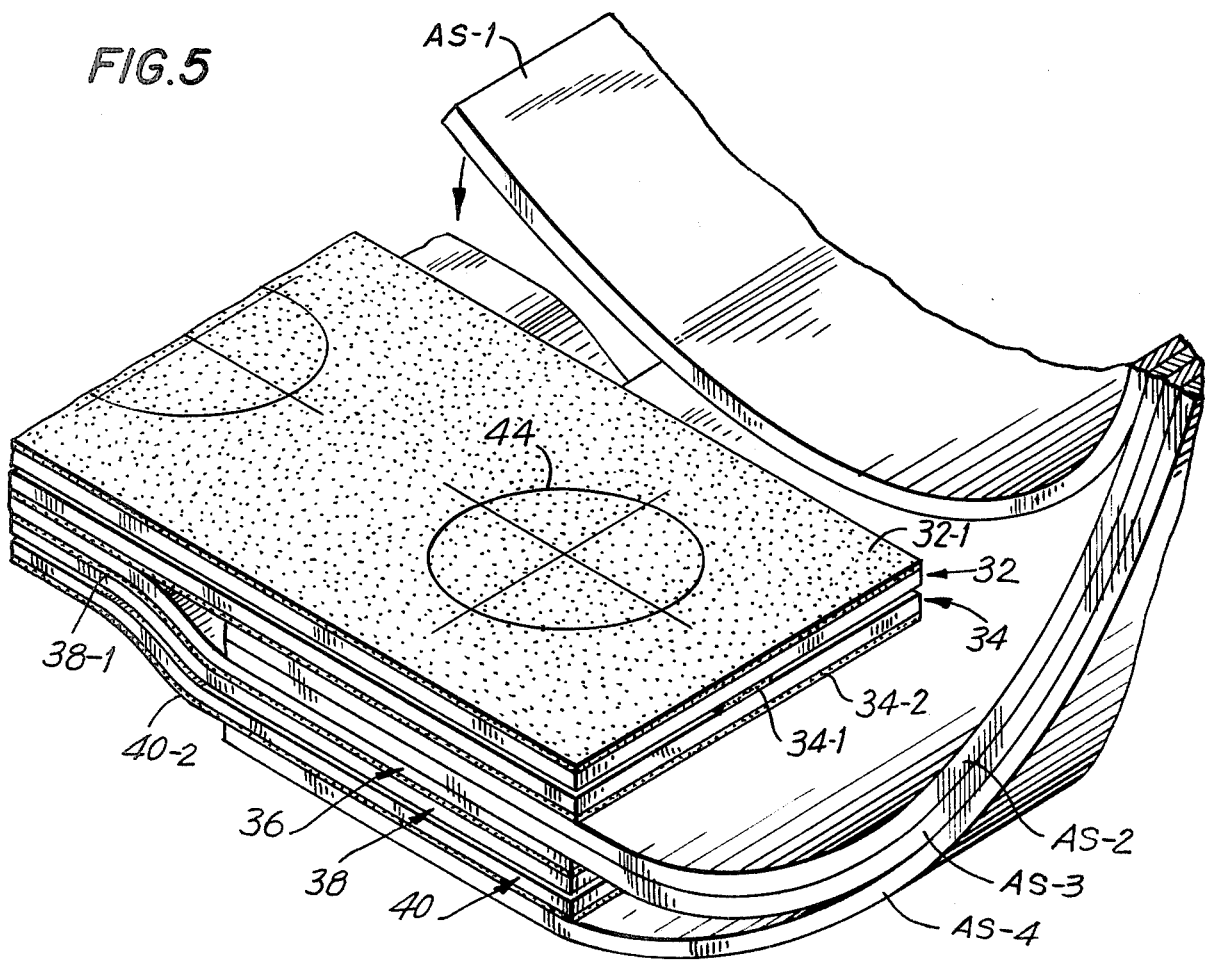
FIG. 5 depicts a view similar to that of FIG. 4, after the initial "sandwich" is made.

FIG. 5 is a view very similar to that of FIG. 4, but shows the bottom three artwork sheets in place, the only remaining step being the lowering of sheet AS-1 and the application of pressure to the top of the sheet.

The reason for the ⅜" overhang of the separator is apparent from an inspection of FIG. 4. Because of the overhang, a knife edge may be placed on top of the separator, along a side edge of the tape system, and forced underneath tape 34 in order to lift it.

FIG. 6 is a sectional view showing the overall "stack" after the steps depicted in FIGS. 4 and 5 are completed, and after the forward edge of the tape system is cut along line 46. Three of the artwork sheets are secured to three respective tapes as described in connection with FIGS. 4 and 5; artwork sheets AS-3 simply rests on top of separator 36. Initially, the five elements of the tape system are held together by the various layers of adhesive described above. But the forward end of the tape system is not cut along dashed line 46 (the drawing showing the "stack" after the cut is made), and following this cutting it is apparent that the two divided parts of the tape system are no longer held together. They are still maintained in alignment, however, because the artwork sheets are aligned, and the tapes are secured to them. To prevent slippage of the sheets, before the cut along line 46 is made, the artwork sheets may be secured to each other, for example, by a thumbtack inserted through them (symbolized by arrow 50) into the illustration board. The thumbtack should be placed near the edges of the artwork sheets, just in back of the tapes.

It should be noted that the cut 46 is made at a point forward of the artwork sheets but in front of hole 36' in the separator. Before the cut is made, tapes 34 and 38 engage each other through hole 36'. (This is not shown in FIG. 6; only the extension of the separator to the left of cut 46 is shown in phantom lines.) After the cut is made, the forward end of the remaining tape system in the roll includes a short section of "solid" separator followed by a hole 36'. As described above, before using the tape system again, the forward end is cut behind the hole 36', the cut piece simply being discarded. The forward edge of the remaining tape roll may be cut in order to allow separation of the two parts of the tape system, as shown in FIG. 4, at the beginning of the process. It should also be noted that the four tape pieces attached to the artwork sheets extend past their forward edges. These overhanging tapes can be cut on an individual basis at the end of the process; alternatively, cut 46 can be made right along the forward edges of the four artwork sheets.

The next step in the process is shown in FIG. 7. The top three artwork sheets are lifted, sheet AS-3 lifting off from separator 36 with no difficulty at all inasmuch as there is little adhesive bond to the Teflon separator. A knife edge 52 is then applied to separator 36 to remove it as shown in the drawing. To whatever extent the adhesive coating on top of tape 38 adheres to the separator, the bonding force between tapes 38 and 40 is greater; thus tape 38 remains in place as the separator is removed.

Thereafter, the top three sheets are lowered. When the top three sheets are lowered, the adhesive coating on tape 38 causes the tape to adhere to the bottom of artwork sheet AS-3, the graphic designer insuring a bond by applying pressure to the top of sheet AS-1.

In the last step of the process (not shown), the sheets are peeled away from each other (after first removing the thumbtack symbolized by arrow 50). As sheet AS-1 is lifted, tapes 32 and 34 separate because the bonding force between them is less than that between tape 34 and sheet AS-2, and between tape 32 and sheet AS-1; it will be recalled that the surface of tape 32 which bears against sheet AS-1 is completely coated with adhesive while only a narrow strip of adhesive secures the two tapes to each other. Thereafter, in a similar fashion, sheet AS-3 is lifted with tape 38 remaining secured to it and separating from tape 40 which remains secured to sheet AS-4.

In a similar manner, register marks may be applied to the four sheets along two other edges.

In the event register marks or other aligned graphic symbols are to be applied to only three artwork sheets, only a three-tape system would be used. In this case, referring to FIG. 7, tape 40 and sheet AS-4 would be omitted, or tape 32 and sheet AS-1 would be omitted. (The omission of either tape from the tape system is the equivalent of the omission of the other, inasmuch as the tape system is symmetrical on the two sides of the separator.) Similarly, if only two sheets require aligned markings, only tapes 32 and 34, or tapes 38 and 40, would be used, the tape system not even including a separator. In this case, tapes 38 and 40, for example, would be placed between two superimposed artwork sheets. Since the outer surfaces of the two-tape system contain the stronger adhesive and form stronger bonds with the artwork sheets than the bond between the two tapes, the tapes separate when one of the sheets is lifted from the other.

FIG. 8 depicts the multi-layer graphic arts tape system of my invention in sheet form. System 60 includes four tape sheets and a separator sheet arranged as described above. The letters A-D in FIG. 8 simply represent aligned symbols. The sheet form of my invention can be thought of as a plurality of side-by-side tape systems, each individual tape system extending in the vertical direction of the drawing. Separator holes 64 separate the symbols as in the roll form of the invention. Before using any section of the tape system, a vertical column of symbols may be cut off and then used as described above. Alternatively, an individual symbol and hole, such as that shown by dashed line 66, may be cut from the sheet. The cut section should include a hole because, as described above, when the tapes are first being applied to the artwork sheets, the middle tapes remain aligned to each other by virtue of their adhesion in the region of the hole. The sheet form of my invention may include two, three or four tapes, just as the roll form.

It should be noted that the three-ply and four-ply embodiments of my invention find use when register marks or other symbols are to be placed along the edges of artwork sheets (for example, aligned border graphics). This is because when applying the tapes to the artwork sheets, they must remain secured to each other as shown in FIGS. 4 and 5, and the secured sections are outside edges of the artwork sheets. The two-ply embodiment of my invention can be used anywhere within the interior of the artwork sheets since the two tapes self-adhere to each other. A typical example of a two-tape system is shown in FIGS. 9A and 9B.

FIG. 9A depicts the alphabet character J shown by the numeral 70, and a section 72 giving depth to the character. FIG. 9B depicts the symbol printed on each of the two tapes 80 and 82. The character itself is printed on one of the tapes and section 72 is printed on the other. The two outer surfaces 80-1 and 82-2 of the tape "sandwich" are completely coated with adhesive, while a thinner line of adhesive on surface 82-1 secures this surface to the facing surface of tape 80.

Although the invention has been described with reference to particular embodiments, it is to be understood that these embodiments are merely illustrative of the application of the principles of the invention. Numerous modifications may be made therein and other arrangements may be devised without departing from the spirit and scope of the invention.

What I claim is:

1. A multi-layer graphic arts tape system comprising a first clear tape having an adhesive coating on a first surface thereof, a second clear tape having a first surface in facing relationship with the second surface of said first tape and having an adhesive coating on the second surface thereof, a separator strip having a first surface in facing relationship with said second surface of said second tape, a third clear tape having an adhesive coating on a first surface thereof in facing relationship with the second surface of said separator strip, said separator strip containing holes therein for allowing said adhesive coatings on said second surface of said second tape and said first surface of said third tape to adhere to each other in the regions of said holes, an adhesive disposed between said second surface of said first tape and said first surface of said second tape and having a bonding force which is less than that provided by the adhesive coating on each of said first and second tapes when each of said tapes is applied to an application surface, and a plurality of markings on each of said first, second and third tapes aligned with each other.

2. A multi-layer graphic arts tape system in accordance with claim 1 further including a fourth clear tape having a first surface in facing relationship with the second surface of said third tape and having an adhesive coating on the second surface thereof, an adhesive disposed between said second surface of said third tape and said first surface of said fourth tape and having a bonding force which is less than that provided by the adhesive coating on each of said third and fourth tapes when each of said tapes is applied to an application surface, and a plurality of markings on said fourth tape aligned with the markings on said first, second and third tapes.

3. A multi-layer graphic arts tape system in accordance with claim 2 wherein said aligned markings and said holes alternate with each other in the direction of said tapes and said separator strip.

4. A multi-layer graphic arts tape system in accordance with claim 3 wherein said markings are register marks.

5. A multi-layer graphic arts tape system in accordance with claim 3 wherein each group of aligned markings contains at least two individual markings on different tapes which have different shapes.

6. A multi-layer graphic arts tape system in accordance with claim 1 wherein said aligned markings and said holes alternate with each other in the direction of said tapes and said separator strip.

7. A multi-layer graphic arts tape system in accordance with claim 6 wherein said markings are register marks.

8. A multi-layer graphic arts tape system in accordance with claim 6 wherein each group of aligned markings contains at least two individual markings on different tapes which have different shapes.

9. A multi-layer graphic arts tape system comprising a first clear tape having an adhesive coating on a first surface thereof; a second clear tape having a first surface in facing relationship with the second surface of said first tape and having an adhesive coating on the second surface thereof; a separator strip having a first surface in facing relationship with said second surface of said second tape; a third clear tape having an adhesive coating on a first surface thereof in facing relationship with the second surface of said separator strip; an adhesive disposed between said second surface of said first tape and said first surface of said second tape and having a bonding force which is less than that provided by the adhesive coating on each of said first and second tapes when each of said tapes is applied to an application surface, and which is greater than that provided by the adhesive coating on said second surface of said second tape which adheres said second tape to said separator; and a plurality of markings on each of said first, second and third tapes aligned with each other.

10. A multi-layer graphic arts tape system in accordance with claim 9 further including a fourth clear tape having a first surface in facing relationship with the second surface of said third tape and having an adhesive coating on the second surface thereof; an adhesive disposed between said second surface of said third tape and said first surface of said fourth tape and having a bonding force which is less than that provided by the adhesive coating on each of said third and fourth tapes when each of said tapes is applied to an application surface, and which is greater than that provided by the adhesive coating on said first surface of said third tape which adheres said third tape to said separator; and a plurality of markings on said fourth tape aligned with the markings on said first, second and third tapes.

11. A multi-layer graphic arts tape system in accordance with claim 10 wherein said markings are register marks.

12. A multi-layer graphic arts tape system in accordance with claim 10 wherein each group of aligned markings contains at least two individual markings on different tapes which have different shapes.

13. A multi-layer graphic arts tape system in accordance with claim 9 wherein said markings are register marks.

14. A multi-layer graphic arts tape system in accordance with claim 9 wherein each group of aligned markings contains at least two individual markings on different tapes which have different shapes.

* * * * *